(12) United States Patent
Yamamoto et al.

(10) Patent No.: US 7,532,453 B2
(45) Date of Patent: May 12, 2009

(54) BUILT-IN CAPACITOR TYPE WIRING BOARD AND METHOD FOR MANUFACTURING THE SAME

(75) Inventors: Hiroshi Yamamoto, Konan (JP); Toshitake Seki, Aichi (JP); Yasuhiko Inui, Kani (JP); Jun Otsuka, Konan (JP); Manabu Sato, Nagoya (JP)

(73) Assignee: NGK Spark Plug Co., Ltd., Aichi (JP)

( * ) Notice: Subject to any disclaimer, the term of this patent is extended or adjusted under 35 U.S.C. 154(b) by 242 days.

(21) Appl. No.: 11/601,760

(22) Filed: Nov. 20, 2006

(65) Prior Publication Data

US 2007/0121273 A1 May 31, 2007

(30) Foreign Application Priority Data

Nov. 30, 2005 (JP) ............................. 2005-344925

(51) Int. Cl.
*H01G 4/228* (2006.01)
(52) U.S. Cl. .............. 361/306.2; 361/306.1; 361/306.3; 361/311; 361/313; 361/321.2
(58) Field of Classification Search .............. 361/306.3, 361/306.1, 306.2, 311–313, 321.1, 321.2, 361/302–305
See application file for complete search history.

(56) References Cited

U.S. PATENT DOCUMENTS

| | | | | |
|---|---|---|---|---|
| 6,351,369 B1 * | 2/2002 | Kuroda et al. | ............ | 361/306.3 |
| 6,407,907 B1 * | 6/2002 | Ahiko et al. | ............. | 361/306.3 |
| 6,549,395 B1 * | 4/2003 | Naito et al. | ............... | 361/306.1 |
| 6,577,490 B2 * | 6/2003 | Ogawa et al. | ............ | 361/306.1 |
| 6,606,237 B1 * | 8/2003 | Naito et al. | ............... | 361/306.3 |
| 6,876,554 B1 * | 4/2005 | Inagaki et al. | ............... | 361/763 |
| 6,961,230 B2 * | 11/2005 | Otsuka et al. | ............ | 361/306.2 |
| 6,979,890 B2 | 12/2005 | Kambe et al. | | |
| 7,002,075 B2 | 2/2006 | Kambe et al. | | |
| 7,268,419 B2 * | 9/2007 | Cornelius | ................... | 257/686 |
| 7,355,836 B2 * | 4/2008 | Radhakrishnan et al. | . | 361/306.2 |

FOREIGN PATENT DOCUMENTS

| | | |
|---|---|---|
| JP | 2004228190 | 8/2004 |
| JP | 200539243 | 8/2006 |

* cited by examiner

*Primary Examiner*—Nguyen T Ha
(74) *Attorney, Agent, or Firm*—Stites & Harbison PLLC; Ross F. Hunt, Jr.; Jeffrey A. Haeberlin

(57) ABSTRACT

In order to provide a built-in capacitor type wiring board capable of preventing misalignment of the capacitor, a capacitor built-in type wiring board is provided which includes a core board; a multilayer portion disposed on at least one side of the core board and formed by a plurality of interlayer insulating layers; and a plurality of conductor layers alternately laminated on the core board. The capacitor is of a chip-like shape with first and second main surfaces and includes a dielectric layer; electrode layers laminated on the dielectric layer; and a hole portion opening at least at the second main surface. The capacitor is embedded in the interlayer insulating layers so that the second main surface faces the core board.

9 Claims, 10 Drawing Sheets

BUILT-IN CAPACITOR TYPE WIRING BOARD AND METHOD FOR MANUFACTURING THE SAME

FIELD OF THE INVENTION

The present invention relates to a built-in capacitor type wiring board including a built-in capacitor for a wiring board, and to a method for manufacturing the same.

BACKGROUND OF THE INVENTION

In recent years, semiconductor integrated circuit elements (IC chips) used for a CPU in computers or the like operate at higher speeds with more high level functional features than previously. Along with this advance, the number of terminals has increased and the terminal interval has tended to be smaller or narrower. Generally speaking, in such a construction, terminals in large numbers are densely formed on the bottom surface of the IC chip in an array, and a terminal block so formed is connected to a further terminal block at the motherboard side by a conventional "flip chip" connection. However, because there is a large difference in pitch between the terminal block at the IC chip side and the terminal block at the motherboard side, it is difficult to directly connect the IC chip to the motherboard. Therefore, the connection method generally employed is one wherein the IC chip is first mounted on a wiring board adapted for mounting the IC chip, and then the wiring board is mounted on the motherboard. An example of such wiring boards for mounting the IC chip includes a wiring board wherein a capacitor is embedded in a core substrate comprised of a polymer material so as to form a core portion, and a built-up layer is formed on both top and rear surfaces of the core portion, respectively (see e.g., Japanese Patent Application Laid-Open (kokai) No. 2005-39243). Further, a wiring board in which the capacitor is built into the insulating layers has also been disclosed (see, e.g. Japanese Patent Application Laid-Open (kokai) No. 2004-228190).

In order to provide stabilization of the power supply by lowering the inductance between the capacitor and the IC chip, the distance therebetween is preferably made as short as possible. Thus, the current thinking in the art is that the capacitor is preferably embedded in the built-up layer located near the IC chip rather than in the core board.

SUMMARY OF THE INVENTION

A significant disadvantage of the above-described approach, wherein the capacitor is embedded in a built-up layer, is that the capacitor tends to misalign in the planar direction when being mounted on an insulating layer. As a consequence, there is a problem with providing a secure electrical connection between the capacitor and other members of a wiring board, thereby resulting in deterioration in the reliability of the wiring board.

An important object of the present invention is to address and overcome the above-discussed problems, and a further object of the invention is to provide a built-in capacitor type wiring board wherein the reliability of the wiring board is improved by embedding a built-in capacitor therein, as well as to provide a method for manufacturing the same.

According to a first aspect of the invention, in order to solve the above-mentioned problems there is provided a built-in capacitor type wiring board, comprising: a core board; a multilayer portion disposed on at least one side of said core board and comprising a plurality of interlayer insulating layers, and a plurality of conductor layers alternately laminated with said insulating layers on said core board; and a capacitor of a chip-like shape with a first main surface and a second main surface, said capacitor comprising: a dielectric layer; an electrode layer laminated on said dielectric layer; and a hole portion opening at least at said second main surface, and said capacitor being embedded in said interlayer insulating layers such that said second main surface faces said core board.

One important advantage of the built-in capacitor type wiring board described in the preceding paragraph is that because a part of the interlayer insulating layer flows into the hole portion when disposing the capacitor on the interlayer insulating layer, misalignment of the capacitor in the planar direction can be prevented. Further, the capacitor is more tightly fixed in the multilayer portion (between interlayer insulating layers) as compared to an approach where the hole portion is not formed in the capacitor. As a results, the delamination between the capacitor and the interlayer insulating layers can be prevented. Furthermore, when a part of the interlayer insulating layer flows into the hole portion, only a small quantity of the interlayer insulating layer is pushed out from the end face of the second main surface of the capacitor. As a consequence, the planar nature of the interlayer insulating layer is maintained.

The thickness of the entire capacitor is preferably between about 10 μm and 200 μm. When the thickness of the entire capacitor is less than about 10 μm, formation of the built-in capacitor for a wiring board can be difficult. On the other hand, when the thickness of the entire capacitor is larger than about 200 μm, it can be difficult to embed the built-in capacitor in the multilayer portion.

The above-mentioned capacitor may be a via array type capacitor and comprises: a capacitor main body having a structure wherein the dielectric layers and the inner electrode layers are alternately laminated; and a plurality of via holes disposed in a form of array and each hole having a via conductor therein so as to electrically connect the inner electrode layers.

In this embodiment, the capacitor main body constituting the above-mentioned capacitor has a structure wherein the dielectric layers and the inner electrode layers are alternately laminated. Examples of a suitable dielectric layer include a ceramic dielectric layer, a resin dielectric layer and a dielectric layer comprised of ceramic and resin composite material. Suitable examples of the ceramic dielectric layer include dielectric ceramics, such as barium titanate, lead titanate and strontium titanate. When a dielectric ceramic is used, a capacitor with a large electrical capacitance can be produced. In addition, a low-temperature firing ceramic such as a glass-ceramic formed in such a manner that an inorganic ceramic filler, such as alumina, is added to a borosilicic acid system glass or lead borosilicate system glass is preferably employed. Alternatively, a high temperature firing ceramic, such as alumina, alumimium nitride, boron nitride, silicon carbide and silicon nitride, is preferably employed according to the demands of a particular application or the need for a specific property. Further, examples of the resin dielectric layer include an epoxy resin and a tetrafluoroethylene resin (PTFE) having an adhesive property. Suitable examples of the dielectric layer comprised of ceramic and resin composite material include, for the ceramic, barium titanate, lead titanate, strontium titanate or the like, and for the resin material, a thermosetting resin, such as an epoxy resin, phenol, urethane, silicon, polyimide and unsaturated polyester; a thermoplastic, such as polycarbonate, acrylics, polyacetal and polypropylene; or a latex, such as nitril butadiene rubber, styrene butadiene rubber and fluoride rubber.

It is noted that a metal containing layer may be formed on at least either the first main surface or the second main surface of the capacitor main body. The total thickness of the metal containing layers (each provided on the first main surface and the second main surface) may be, for example, between about 15% and 80% of the thickness of the entire capacitor. In this way, the ratio of the metal portion to the entire capacitor is high. As a result, the entire capacitor is reinforced by the metal portion thereby improving the flexibility and the strength thereof. As a result, breakage of the capacitor is prevented, even if the entire capacitor is made thin.

When the total thickness of the metal containing layer occupies less than about 15% of the entire capacitor, the improvement in strength (flexibility) is likely to be small. On the other hand, when the total thickness of the metal containing layer exceeds about 80% of the entire capacitor, the capacitor main body is thin with regard to the entire capacitor and the manufacture thereof can be difficult, thereby, as a result, causing potential malfunction of the capacitor. With a thin capacitor, when the number of dielectric layers and the number of inner electrode layers which constitute the capacitor main body are reduced, the capacitance of the capacitor is lowered. It is noted that the total thickness of the metal containing layer is preferably between about 25% and 70% of the entire capacitor, and more preferably between about 35% and 60% of the entire capacitor. The term "thickness of the entire capacitor" as used herein means a total thickness of: (i) the capacitor main body and (ii) the metal containing layers disposed on each of the first main surface and the second main surface.

Preferably, the metal containing layer is principally comprised of a metal. It is noted that a plurality of terminal electrodes electrically connected to an end face of the via conductor and disposed on the first main surface and the second main surface is included in the metal containing layer. When the dielectric layer is the above-mentioned ceramic dielectric layer, a metal material suitable for metallization and capable of being sintered simultaneously with ceramic is preferred and may be comprised of, for example, nickel, molybdenum, tungsten, titanium, copper, silver or the like. Although the metal containing layer can be a pure metal layer, a metal layer including glass or a composite metal layer containing a ceramic as a filler, which constitutes the ceramic dielectric layer, is preferably employed. Such a metal containing layer is capable of adjusting the firing behavior of the metal containing layer and the ceramic dielectric layer at the time of the co-firing process, lessening the effect of the difference in thermal expansion coefficient between the metal containing layer and the ceramic dielectric layer when undergoing a thermal shock and providing secure adhesion therebetween. Therefore, the metal containing layer can firmly adhere to the ceramic dielectric layer.

On the other hand, when the dielectric layer is the above-mentioned resin dielectric layer or a dielectric layer comprised of ceramic and resin composite material, the dielectric layer does not sinter. Thus, the metal containing layer is formed in the capacitor main body, not by the firing method, but instead is formed by a plating method or laminating a metallic foil. The metal containing layer is formed using a metal, such as nickel, copper or cobalt, or alloys, such as kovar. Alternatively, the metal containing layer is formed using a nickel-boron (Ni—B) plating or a nickel—phosphorous (Ni—P) plating or the like.

The thickness of the metal containing layer is determined according to the thickness of the capacitor main body. For example, when the thickness of the capacitor main body is between about 10 μm and 200 μm, the thickness of the metal containing layer disposed on at least either the first main surface or the second main surface is preferably between about 3 μm and 50 μm. When the thickness of the metal containing layer is less than 3 μm, the flexibility of the entire capacitor cannot be fully improved. On the other hand, when the thickness of the metal containing layer is larger than 50 μm, the entire capacitor becomes too thick. Further, the metal containing layer disposed on the first main surface and the metal containing layer disposed on the second main surface preferably have the same thickness. In this way, any unevenness, camber or ridging of the capacitor can be reduced. As a result, the planarity or flatness of a mounting face of the multilayer portion accommodating the capacitor is improved, thereby improving reliability after mounting a semiconductor device. In addition, when the metal containing layer includes a plurality of terminal electrodes, a predetermined clearance between the adjacent terminal electrodes is preferably provided.

The capacitor main body may include one or more reinforcement layers which are preferably thicker than that of the inner electrode layer inside thereof. In this way, the entire capacitor is reinforced by the metal containing layer, thereby improving he flexibility and strength of the capacitor. Thus, breakage of the capacitor is prevented, even if the entire capacitor is made thin.

The reinforcement layer may serve as an inner electrode layer, or may not serve as an inner electrode layer. When the reinforcement layer serves as an inner electrode layer, the capacitor can securely operate even if the ratio of the thickness of the reinforcement layer to the capacitor main body is large.

The reinforcement layer is preferably comprised of nickel, molybdenum, tungsten, titanium, copper, silver or the like. When the dielectric layer is comprised of ceramic, a suitable material for forming the reinforcement layer includes a material capable of being co-fired with ceramic.

Although the material used in forming the inner electrode layer (electrode layer) and the via conductor is not specifically limited to the following, a metal which can be sintered simultaneously with the ceramic such as, for example, nickel, molybdenum, tungsten, titanium or the like is preferably employed when a ceramic sintered body formed at the high temperature is adopted for use. When a low-temperature ceramic sintered body, which is fired at below 1000° C., is adopted, copper, silver or the like can be employed for the inner electrode layer and the via conductor.

On the other hand, when the dielectric layer is the above-mentioned resin dielectric layer or the above-mentioned dielectric layer comprised of ceramic and resin composite material, the dielectric layer does not sinter. Thus, the inner electrode layer is formed in the capacitor main body, not by the firing method, but is instead formed by a plating method or laminating a metallic foil. The inner electrode layer and the via conductor are formed using a metal, such as nickel, copper or cobalt, or alloys, such as kovar. Alternatively, the inner electrode layer and the via conductor are formed using a nickel-boron (Ni—B) plating or a nickel—phosphorous (Ni—P) plating or the like.

The above-mentioned capacitor may be of a type which has a thickness greater than that of the dielectric layer and includes the metal reinforcement layer so as to support the dielectric layer. In this way, the number of layers of the capacitor is less than that of the via array type capacitor, and the thickness of the entire capacitor is less, i.e., the capacitor is relatively thin, thereby resulting in the capacitor being easily embedded in the multilayer portion. Further, if this type of capacitor is provided with the metal reinforcement layer, the strength of the capacitor can be maintained even if the capacitor is made thin.

When the thickness of the dielectric layer and the thickness of the electrode layer is between about 1 µm and 10 µm, the thickness of the metal layer for reinforcement (reinforcement layer) is preferably between about 10 µm and 100 µm. It can be difficult to maintain the strength of the capacitor when the thickness of the metal reinforcement layer is less than about 10 µm. On the other hand, when the thickness of the metal reinforcement layer exceeds about 100 µm, it is difficult to accommodate the capacitor in the multilayer portion.

Although the material used in forming the metal reinforcement layer is not specifically limited to the following, a metal which can be sintered simultaneously with ceramic, such as for example, nickel, molybdenum, tungsten, titanium or the like, is preferably employed when the ceramic sintered body formed at a high temperature is adopted for use as the dielectric layer. When a low-temperature ceramic sintered body which is fired at below 1000° C. is adopted as the dielectric layer, copper, silver or the like can be employed for the metal layer.

On the other hand, when the dielectric layer is the above-mentioned resin dielectric layer or the above-mentioned dielectric layer comprised of ceramic and resin composite material, the dielectric layer does not sinter, and the metal reinforcement layer is preferably formed using a metal, such as nickel, copper or cobalt, or an alloy, such as kovar.

Although the hole portion may be a non-through-hole opening only at the second main surface or may be a through-hole opening at both first main surface and the second main surface, a through-hole is preferable. In this way, the hole portion can be formed by a simple boring process, thereby easily producing the capacitor. Since a part of the interlayer insulating layer flows into the hole portion when disposing the capacitor on the interlayer insulating layer, misalignment of the capacitor in the planar direction can be prevented. Further, while a part of the interlayer insulating layer flows into the hole portion, only a small quantity of the interlayer insulating layer is pushed out from the end face of the second surface of the capacitor. Thus, the coplanar relation of the interlayer insulating layer is secured. Furthermore, since a part of the interlayer insulating layer flowing into the hole portion extends to the interlayer insulating layer on the first main surface of the capacitor, the capacitor is more tightly fixed in the multilayer portion (i.e., between the interlayer insulating layers).

Although the hole portion may be disposed in any part of the capacitor, the hole portion is preferably disposed in plural locations along the outer circumference of the capacitor. In this way, the interlayer insulating layer is unlikely to be pushed out from the end face of the second main surface of the capacitor because a part of the interlayer insulating layer flows into the hole portions disposed along the outer circumference of the capacitor. Further, when a part of the interlayer insulating layer flows into the plural hole portions, the interlayer insulating layer is unlikely to be pushed out from the end face of the second main surface of the capacitor, and also, delamination of the outer circumference portion of the capacitor is effectively prevented. Furthermore, by disposing the hole portions along the outer circumference of the capacitor, the hole portion is unlikely to be a hindrance to a circuit activating or utilizing the capacitance of the capacitor.

In addition, although a diameter of the hole portion may be larger or smaller than that of the via hole, or may be equal to the diameter of the via hole, the diameter of the hole portion is preferably equal to or smaller than that of the via hole. In this way, any strength degradation of the capacitor due to the formation of the hole portion can be substantially reduced or prevented. Further, the number of hole portions can be increased by reducing the size of the hole portion. Therefore, a part of the interlayer insulating layer can easily flow into the hole portion, thereby further preventing misalignment of the capacitor in the planar direction.

Examples of methods for forming the hole portion include a mechanical method, such as a boring process wherein a hole is made in the capacitor using a drill, a punching pin or a punching tool having a plurality of punching pins. However, in embodiments of the present invention, since the capacitor is thin enough so as to be embedded in the multilayer portion and thus is much thinner than a thick core board (which typically has a thickness of about 0.8 mm), it is preferable to avoid administering a mechanical shock to the thin capacitor. Therefore, a preferable method for forming the hole portion is a method that does not provide such a mechanical shock, such as using a laser irradiated from a laser processing machine or the like.

In embodiments of the invention, the corners of the capacitor are preferably chamfered. With these chamfered corners, the stress imposed on the corner of the capacitor at the time of handling the capacitor (e.g., when embedding the capacitor in the multilayer portion) can be decreased, thereby preventing any chipping of the corner. Further, when heat stress is imposed on the capacitor-built-in type wiring board, cracking generated due to a difference in thermal expansion between the capacitor and the interlayer insulating layers, which constitute the multilayer portion, can be prevented. Conventionally known chamfering methods, such as C-chamfering and R-chamfering, may be used. With this construction, chipping produced by objects or products that come into contact with each other in the production steps can be prevented.

Although the material used in forming the substrate core is not limited to the following, a preferred substrate core is principally comprised of a polymer material. Examples of polymer materials that may be used in forming the substrate core include EP resin (epoxy resin), PI resin (polyimide resin), BT resin (bismaleimide triazine resin), PPE resin (polyphenylene ether resin) and the like. Further, a composite material made of these resins and glass fiber (glass woven fabric and non-woven glass fabric), or made of these resins and organic fibers such as polyamide fiber is employed. Furthermore, a dielectric ceramic or a glass-ceramic composite material may be used in addition to a polymer material.

The multilayer portion preferably has a laminated structure wherein the interlayer insulating layers, which are principally comprised of a polymer material, and the conductor layers are alternately laminated. The multilayer portion can be formed by a conventional known method, such as a built-up method. The multilayer portion may be formed only at one side of the core board, or may be formed at both sides of the core board. It is noted that the area corresponding to a built-in capacitor for a wiring board is preferably formed as a semiconductor element mounting portion on the surface of the multilayer portion. When a semiconductor device is mounted on such a semiconductor element mounting portion, the distance between the built-in capacitor for a wiring board and the semiconductor device is decreased as compared with the case wherein the built-in capacitor for a wiring board is provided in the core board. Thus, stabilization of the power supply is attained by lowering the inductance between the built-in capacitor for the wiring board and the semiconductor device.

A preferred method for manufacturing the above-described built-in capacitor type wiring board having a built-in capacitor for a wiring board disposed therein comprises: a preparation step in which a built-in capacitor is prepared which is of a chip-like shape and has a first main surface and a second main surface, and which is comprised of a dielectric layer, an electrode layer laminated on said dielectric layer and a hole portion opening at least at said second main surface, a mounting step in which said capacitor is mounted on an interlayer insulating layer which constitutes part of a multilayer portion comprising a plurality of interlayer insulating layers and a plurality of conductor layers alternately laminated on a core board, so that a part of said interlayer insulating layer may flow into said hole portion by means of mounting said capacitor so as to face said second main surface; and an enclosure step in which a further interlayer insulating layer is laminated on said capacitor after said mounting step so as to enclose said capacitor in said multilayer portion.

Therefore, according to this manufacturing method, when mounting the capacitor on the interlayer insulating layer, a part of the interlayer insulating layer flows into the hole portion so that any misalignment of the capacitor in the planar direction can be prevented. Further, the capacitor is more firmly fixed in the multilayer portion (between interlayer insulating layers) as compared with the case wherein the hole portion is not formed in the capacitor. Therefore, any delamination between the capacitor and the interlayer insulating layers is prevented. Furthermore, when a part of the interlayer insulating layer flows into the hole portion, only a small quantity of the interlayer insulating layer is pushed out from the end face of the second main surface of the capacitor. Thus, the coplanar relation of the interlayer insulating layer is secured. As a result, the reliability of the capacitor-built-in type wiring board can be improved.

Hereinafter, one preferred embodiment of a method for manufacturing the capacitor-built-in type wiring board will be described.

In the previously mentioned preparation step, the built-in capacitor of a chip-like shape having the aforementioned first main surface and a second main surface, and comprising the dielectric layer, the electrode layer laminated on the dielectric layer and the hole portion opening at least at the second main surface is produced in advance, using a conventional known method. For example, when the dielectric layer is a ceramic dielectric layer, the built-in capacitor for a wiring board is produced by a method such that the ceramic dielectric layer is co-fired with the electrode layer, or a metal paste is applied to the ceramic dielectric layer after firing the ceramic dielectric layer, and then thus-applied paste is subjected to a post-firing process to form an electrode layer. Further, when the dielectric layer is the above-mentioned resin dielectric layer or a dielectric layer comprised of ceramic and resin composite material, the built-in capacitor for a wiring board is produced such that the electrode layer is formed on the ceramic dielectric layer using a plating method or the like.

Subsequently, in the mounting step, the capacitor is mounted on the unhardened interlayer insulating layer, which constitutes part of the multilayer portion, so that the second main surface of the capacitor faces the interlayer insulating layer. In this case, the capacitor may be disposed on an interlayer insulating layer located near the core board, or may be disposed on an interlayer insulating layer far removed from the core board. However, the core board can more stably support the capacitor as the capacitor is brought close to the core board. On the other hand, when a semiconductor element mounting portion is formed on the surface of the multilayer portion in which the capacitor is embedded, the distance between the capacitor and a semiconductor device to be mounted on the semiconductor element mounting portion decreases as the capacitor is located further and further away from the core board. As a result, the inductance between the capacitor and the semiconductor device substantially decreases, thereby facilitating stabilization of the associated power supply.

In the subsequent enclosure step, another interlayer insulating layer is laminated on the capacitor so that the capacitor is enclosed in the multilayer portion. As a result, the built-in capacitor type wiring board is completed. When the interlayer insulating layer is comprised mainly of resin, a process for curing resin may be performed after the enclosure step, or may be performed after the mounting step. When the interlayer insulating layer is a photo-setting resin, one example of a suitable curing process is one in which light in the ultraviolet region is irradiated onto the unhardened interlayer insulating layer. Further, when the interlayer insulating layer is a thermosetting resin, one example of the curing process is one in which the unhardened interlayer insulating layer is heated.

Further features and advantages of the present invention will be set forth in, or apparent from, the detailed description of preferred embodiments thereof which follows.

DESCRIPTION OF THE PREFERRED EMBODIMENTS

First Embodiment

Hereinafter, a first embodiment of a built-in capacitor type wiring board in accordance with the present invention will be described in detail with reference to the drawings.

Figure 1:
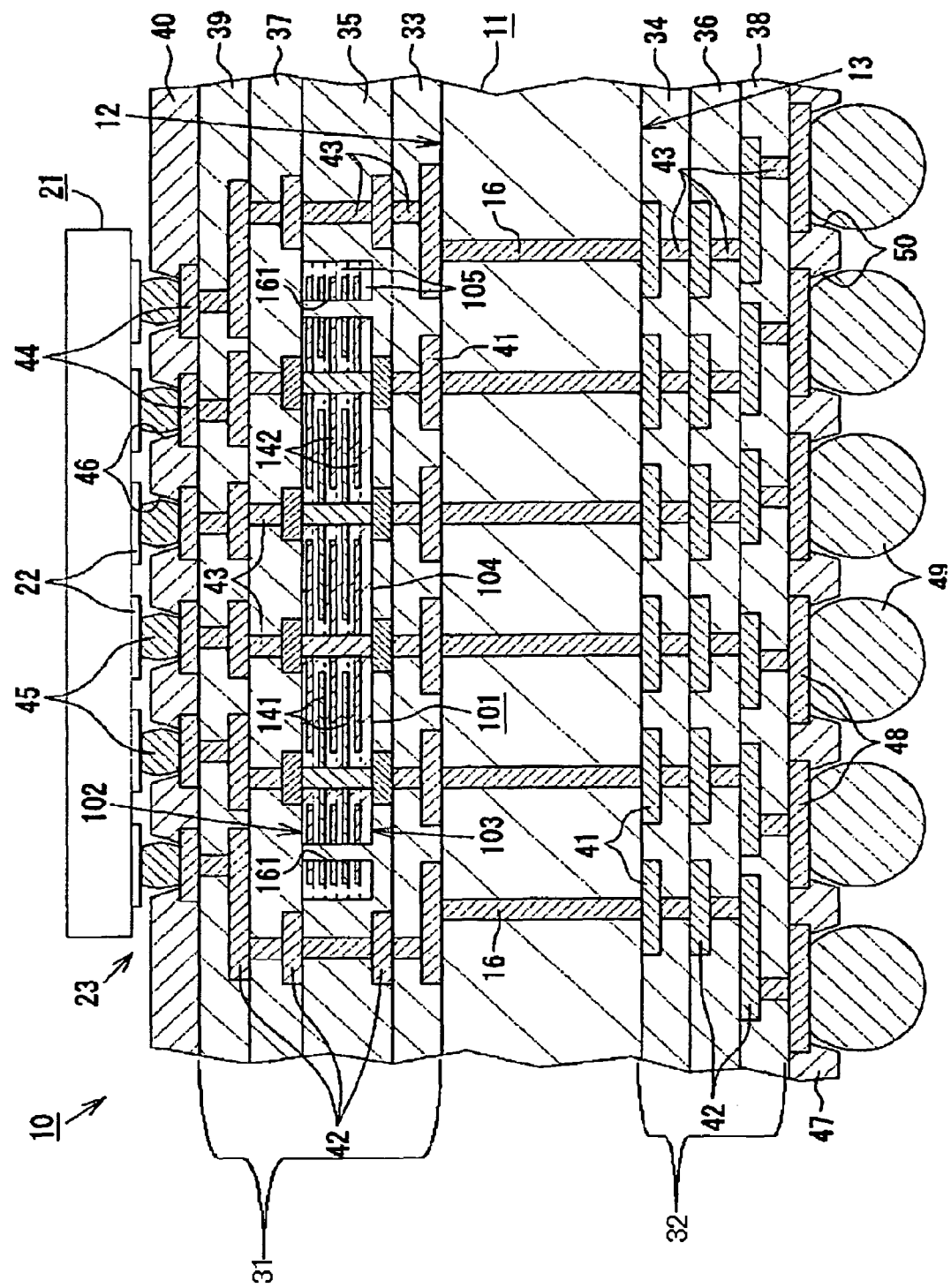
FIG. 1 is a schematic longitudinal cross-sectional view showing a built-in capacitor type wiring board according to a first embodiment.

As shown in FIG. 1, a built-in capacitor type wiring board 10 according to this embodiment is a wiring board for mounting an IC chip, and comprises: a substrate core 11 comprised of glass epoxy and of a generally rectangular shape; a built-up layer 31 (a multilayer portion) formed on an upper surface 12 of the substrate core 11; and a built-up layer 32 formed on an lower surface 13 of the substrate core 11. Via conductors 16 are formed at plural locations in the substrate core 11. The via conductors 16 electrically connect the upper surface 12 and the lower surface 13 of the substrate core 11. Conductor layers 41, comprised of copper, are formed in a pattern on both upper surface 12 and lower surface 13 of the substrate core 11 so that each conductor layer 41 is electrically connected to the via conductor 16.

The built-up layer 31 formed on the upper surface 12 of the substrate core 11 has a structure wherein resin insulating layers 33, 35, 37, 39 (each layer being hereinafter referred to as an interlayer insulating layer) comprised of epoxy resin, and a conductor layer 42 comprised of copper, are alternately laminated. Terminal pads 44 are formed in an array at plural locations on the surface of a fourth resin insulating layer 39. Moreover, the surface of the resin insulating layer 39 is almost entirely covered with a solder resist 40. Openings 46 at which the terminal pads 44 are exposed are formed at the predetermined locations in the solder resist 40. A plurality of solder bumps 45 is disposed on the respective surfaces of the terminal pads 44. Each solder bump 45 is electrically connected to a planar connection terminal 22 of an IC chip 21 serving as a semiconductor integrated circuit element. In addition, each terminal pad 44 and each solder bump 45 is located within an area directly above a built-in capacitor for a wiring board 101 in the built-up layer 31, and this area serves as a semiconductor element mounting portion 23. The resin insulating layers 33, 35, 37, 39 include via conductors 43, respectively. These via conductors 43 electrically connect the conductor layers 41, 42 and the terminal pads 44.

As shown in FIG. 1, the built-up layer 32 formed on the lower surface 13 of the substrate core 11 has the almost the same structure as that of the built-up layer 31. In other words, the built-up layer 32 has a structure wherein resin insulating layers 34, 36, 38 comprised of epoxy resin and a conductor layer 42 are alternately laminated. BGA pads 48, which are electrically connected to the conductor layers 42 through the via conductors 43, are formed at plural locations on the lower surface of a third resin insulating layer 38 with a lattice pattern. The lower surface of the resin insulating layer 38 is almost entirely covered with a solder resist 47. Openings 50 at which the BGA pads 48 are exposed are formed in the predetermined locations of the solder resist 47. Plural solder bumps 49 electrically connected to a motherboard (not illustrated) are disposed on the surfaces of the respective BGA pads 48. The built-in capacitor type wiring board 10 is mounted on the motherboard (not illustrated) through the solder bumps 49.

Figure 2:
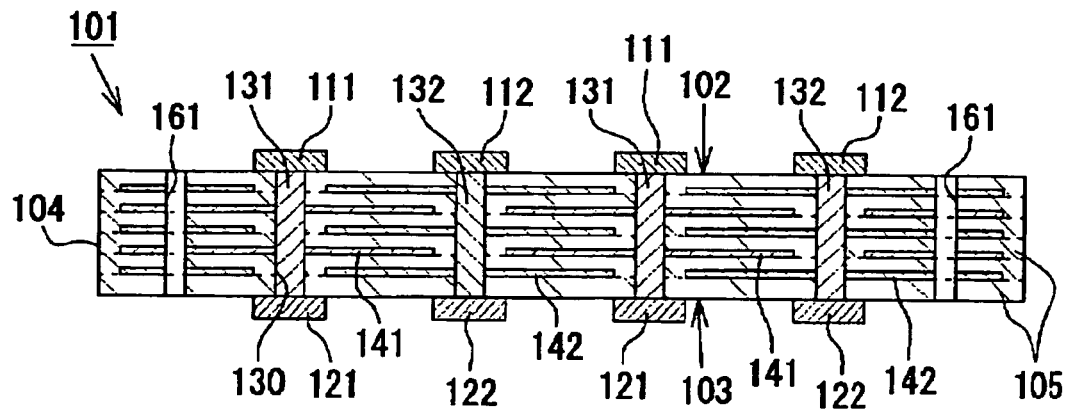
FIG. 2 is a schematic transverse cross-sectional view showing a built-in capacitor for a wiring board according to the first embodiment.
Figure 3:
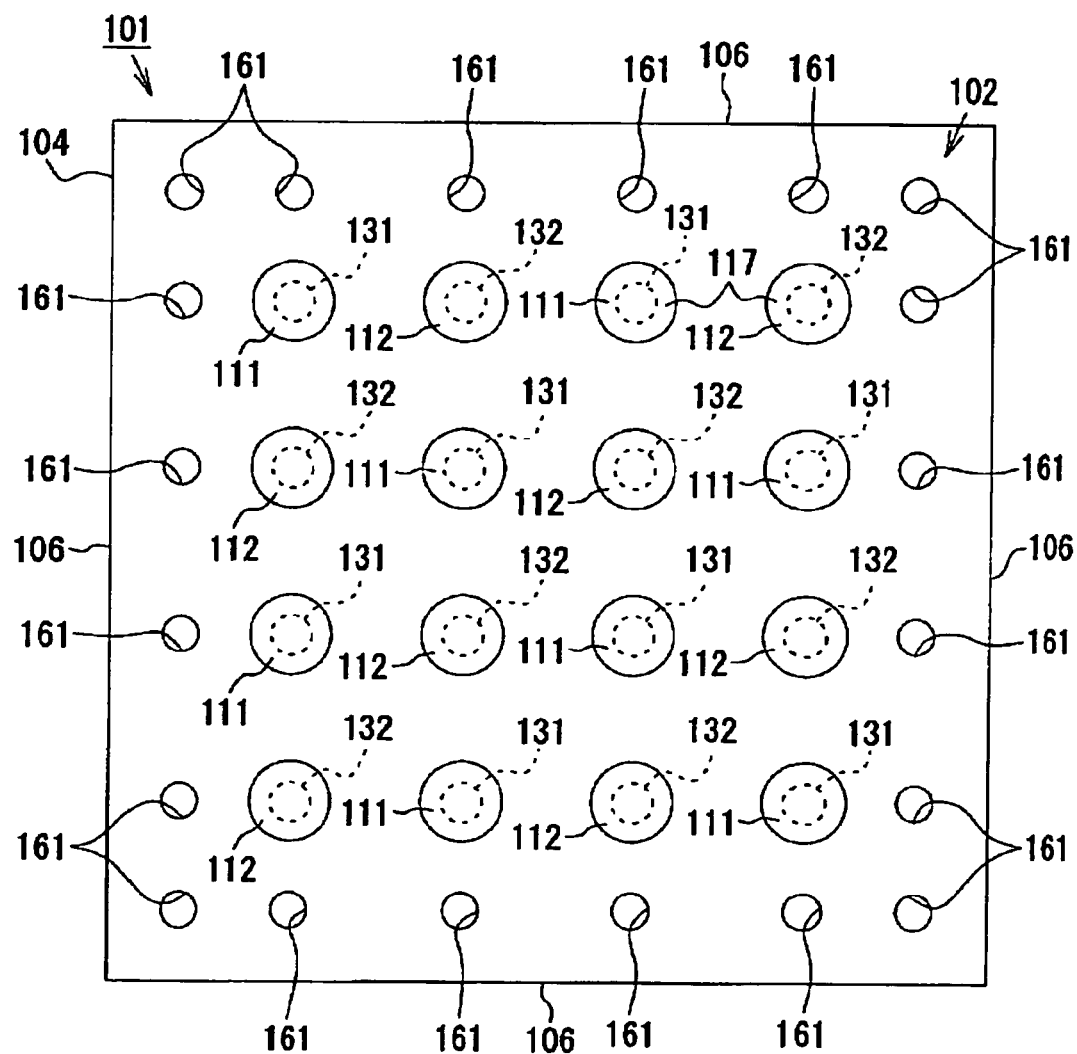
FIG. 3 is a schematic top plan view showing a built-in capacitor for a wiring board according to the first embodiment.

The built-in capacitor for a wiring board 101 (hereinafter referred to as "capacitor 101") shown in FIGS. 2 and 3 is embedded in the center of the built-up layer 31. A capacitor main body 104 constituting the capacitor 101 of this embodiment has a generally rectangle plate-like form, in a plain view, with four sides 106 and has dimensions of 15.0 mm(length)× 15.0 mm(width)×0.08 mm(thickness).

As shown in FIGS. 1 to 3, the capacitor main body 104 is a chip-like member having an upper surface 102 (also referred to as a first main surface) and a lower surface 103 (also referred to as a second main surface). The resin insulating layer 37 constituting the built-up layer 31 is formed on the upper surface 102, and the resin insulating layer 33 constituting the built-up layer 32 is formed on the lower surface 103. That is, the capacitor 101 is disposed in the built-up layer 31 so that the lower surface 103 thereof may face the core board 11. The capacitor main body 104 has a structure wherein a first inner electrode layer 141 (inner electrode layer) and a second inner electrode layer 142 (inner electrode layer) are alternately laminated by sandwiching a ceramic dielectric layer 105 therebetween. The ceramic dielectric layer 105 is comprised of a sintered body of barium titanate, a high permittivity ceramic, and functions as a dielectric (insulator) between the first internal electrode layer 141 and-the second internal electrode layer 142. The first inner electrode layer 141 and the second inner electrode layer 142 are comprised mainly of nickel and are alternately disposed in the capacitor main body 104.

As shown in FIGS. 2 and 3, a plurality of via holes 130 is formed in the capacitor main body 104. These via holes 130 penetrate the capacitor main body 104 in the thickness direction and are disposed in a lattice pattern (i.e., in the form of an array) over the whole surface. In this embodiment, the via hole 130 has a diameter of about 100 μm. Further, in each via hole 130, a plurality of via conductors 131, 132 comprised mainly of nickel are formed so as to extend between the upper surface 102 and the lower surface 103 of the capacitor main body 104. That is, these via conductors 131, 132 are also disposed in a lattice pattern (i.e., in the form of an array) over the whole surface. Each first via conductor 131 extends through each first inner electrode layer 141 so that the first inner electrode layers 141 is electrically connected to each other. Each second via conductor 132 extends through each second inner electrode layer 142 so that the second inner electrode layers 142 is electrically connected to each other. In other words, the capacitor 101 of this embodiment is so-called "a via array type capacitor".

As shown in FIGS. 1 to 3, a plurality of first outer terminal electrodes 111, 112 is formed on the upper surface 102 of the capacitor main body 104 so as to protrude therefrom. The first outer terminal electrodes 111, 112 are disposed in a lattice pattern (i.e., in the form of an array) over the whole upper surface 102. On the other hand, a plurality of second outer terminal electrodes 121, 122 is formed on the lower surface 103 of the capacitor main body 104 so as to protrude therefrom. The second outer terminal electrodes 121, 122 are disposed in a lattice pattern (i.e., in the form of an array) over the whole lower surface 103. Further, each first outer terminal electrode 111, 112 disposed at the upper surface 102 is electrically connected to the via conductor 43. On the other hand, each second outer terminal electrode 121, 122 disposed at the lower surface 103 is electrically connected to an electrode (terminal) of a motherboard (not illustrated) through the via conductors 16, 43, the conductor layers 41, 42, the BGA pad 48 and the solder bump 49. Furthermore, a generally center portion of the bottom surface of each first outer terminal electrode 111, 112 is directly connected to the end face at the upper surface 102 of the respective via conductor 131, 132. Similarly, the generally center portion of the bottom surface of each second outer terminal electrode 121, 122 is directly connected to the end face at the lower surface 103 of the via conductor 131, 132. Therefore, each outer terminal electrode 111, 121 is electrically connected to the via conductor 131 and each first internal electrode layer 141, and the outer terminal electrode 112, 122 is electrically connected to the via conductor 132 and the second internal electrode layer 142, respectively.

As shown in FIG. 2, the first outer terminal electrode 111, 112 is comprised mainly of nickel and contains a small quantity of barium titanate which is the same material as that of the ceramic dielectric layer 105. Similarly, the second outer terminal electrode 121, 122 is also comprised mainly of nickel and contains a small quantity of barium titanate which is the same material as that of the ceramic dielectric layer 105. As shown in FIG. 3, the outer terminal electrodes 111, 112, 121, 122 assume a circular form as viewed in a direction perpendicular to the upper surface 102. In this embodiment, the diameter of the outer terminal electrodes 111, 112, 121, 122 is about 495 µm, and the minimum pitch therebetween is about 580 µm.

As shown in FIGS. 1 to 3, the capacitor main body 104 includes a circular shaped hole portions 161 therein which open at both upper surface 102 and the lower surface 103. In other words, in this embodiment, the hole portion 161 is a through-hole. A plurality of hole portions 161 is disposed along the outer circumference of the capacitor 101. More specifically, the plurality of hole portions 161 is disposed along each side 106 (six holes in each side in this embodiment) so as to surround all via holes 130. The diameter of the hole portion 161 is about 100 µm in this embodiment, which is the same as the diameter of the via hole 130. Further, the minimum pitch between the hole portions 161 is about 580 µm in this embodiment, almost equal to the minimum pitch between the via holes 130.

When a voltage is applied to the first internal electrode layer 141 and the second internal electrode layer 142 through the second outer terminal electrodes 121, 122 from the motherboard side, a positive charge will appear on, for example, the first internal electrode layer 141, and a negative charge will be appear on, for example, the second internal electrode layer 142. As a result, the capacitor 101 is able to function. Moreover, in the capacitor 101, the first via conductors 131 and second via conductors 132 are alternately and adjacently disposed so that the direction of current flow through the first via conductor 131 and the second via conductor 132 may be mutually opposed. As a result, a reduction in the attendant inductance is attained.

Next, a method for manufacturing the built-in capacitor type wiring board 10 according to the first embodiment will be described.

In a preparatory step, the core board 11 and the capacitor 101 are respectively produced in advance, using a conventional known method.

Figure 6:
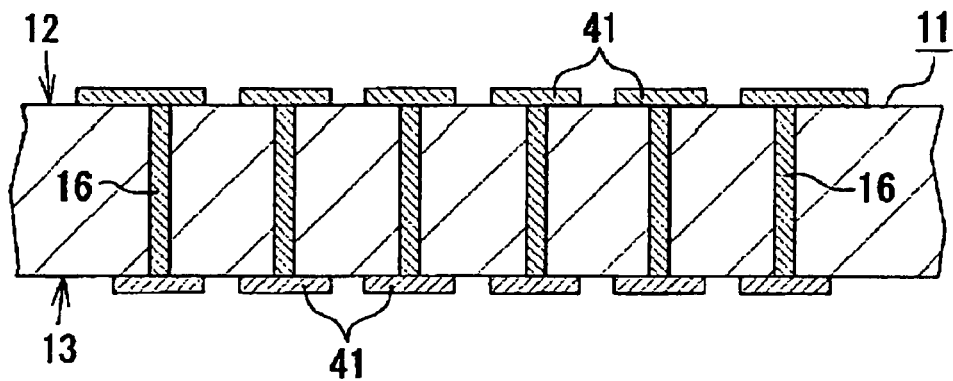
FIG. 6 is an explanatory cross-sectional view showing a further aspect of a method for manufacturing a built-in capacitor type wiring board according to the first embodiment.

The core board 11 is produced as follows. First, a copper-clad laminated board wherein a copper foil with a thickness of 35 µm is laminated on both surfaces of a substrate having the dimensions of 415 mm (length)×410 mm (width)×0.87 mm (thickness) is prepared. Next, a boring operation is performed in advance of the copper-clad lamination using a drilling machine to form a through-hole (not illustrated) for the via conductor 16 in a predetermined location. Further, the via conductor 16 is formed by an electroless copper plating filling inside of each through hole. Furthermore, the copper foil laminated on both surfaces of the copper-clad lamination board is etched to form the pattern of the conductor layer 41 by, for example, a subtractive method. More specifically, after performing the electroless copper plating operation, the electrolytic copper plating is applied thereto employing the electroless copper plating layer as a common electrode. Subsequently, a dry film is laminated on thus-plated surface and subjected to an exposure and a development operation to thereby form a predetermined pattern. In this process, any unnecessary portions of the electrolytic copper plating layer, electroless copper plating layer and the copper foil are removed by etching. Then, the dry film is peeled to complete the core board 11 (refer to FIG. 6).

Figure 4:
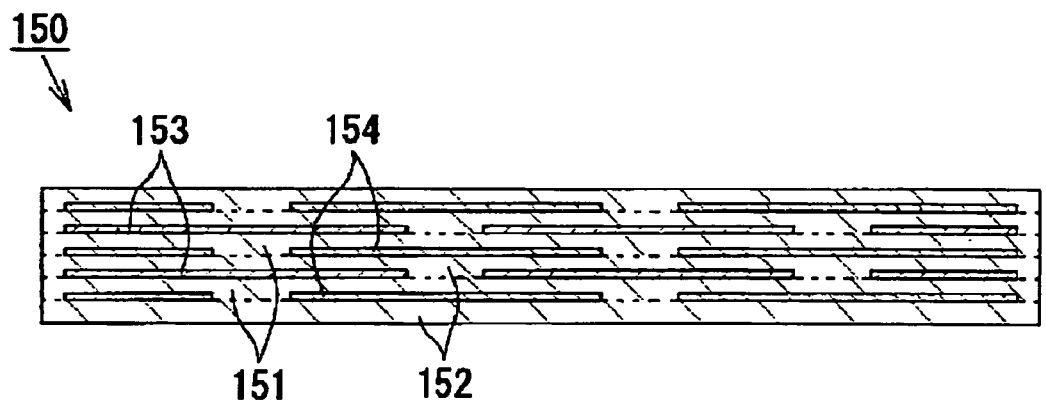
FIG. 4 is an explanatory cross-sectional view showing a step in a method for manufacturing a built-in capacitor type wiring board according to a first embodiment.

The capacitor 101 is produced as follows. A ceramic green sheet 151, 152 comprised of ceramic is produced, and then a nickel paste for an internal electrode layer is screen-printed on these green sheets 151, 152 and dried. Accordingly, a first internal electrode portion 153 serving as the first internal electrode layer 141 and a second internal electrode portion 154 serving as the second internal electrode layer 142 are formed. Next, the green sheet 151 in which the first internal electrode portion 153 is formed and the green sheet 152 in which the second internal electrode portion 154 is formed are alternately laminated and pressed in the direction of lamination to thereby integrate each green sheets 151, 152. As a result, a ceramic non-sintered body 150 is formed (see FIG. 4). In addition, the ceramic non-sintered body 150, in which a plurality of product areas for the capacitor 101 is disposed in the lengthwise and crosswise directions along the planar direction, is a plate-like member adapted to be cut into a plurality of individual capacitors (not shown).

Figure 5:
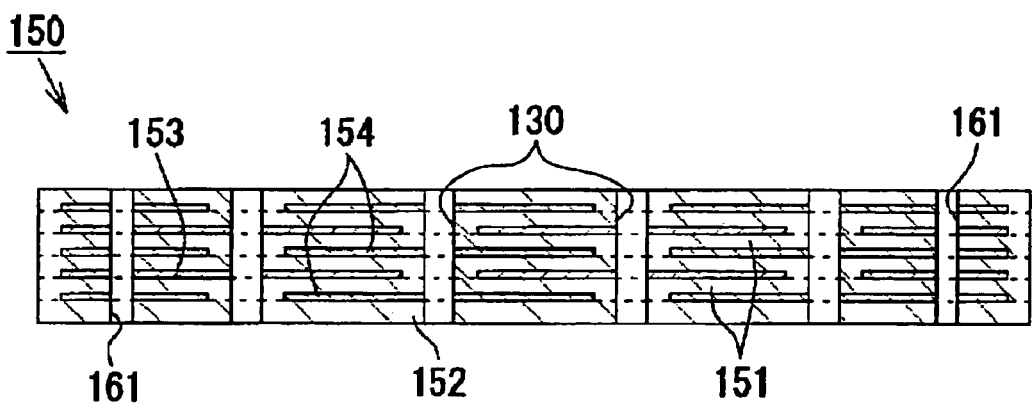
FIG. 5 is an explanatory cross-sectional view showing a further step in a method for manufacturing a built-in capacitor type wiring board according to the first embodiment.

A plurality of via holes 130 and a plurality of hole portions 161 are then formed in the ceramic non-sintered body 150 using a laser processing machine (refer to FIG. 5). Next, a nickel paste for via conductor is filled in each via hole 130 using a pressure filling machine (not shown). In a further step, a paste is printed on an area serving as an upper surface of the ceramic non-sintered body 150 to form the first outer terminal electrodes 111, 112 so as to cover the upper end face of each conductor portion at the upper side of the ceramic non-sintered body 150. The paste is printed on an area serving as a lower surface of the ceramic non-sintered body 150 to form the second outer terminal electrodes 121, 122 so as to cover the lower end face of each conductor portion at the lower side of the ceramic non-sintered body 150. Further, a conventionally known groove (not shown) is formed on the border between the above-mentioned adjacent product areas using a laser.

Subsequently, the ceramic non-sintered body 150 having a groove is dried so that the outer terminal electrode 111, 112, 121, 122 may be solidified to some extent. Next, the ceramic non-sintered body 150 is degreased and subjected to firing at a predetermined temperature for a predetermined time. As a result, the barium titanate and nickel contained in the paste are simultaneously sintered, thereby forming the capacitor to be cut into individual parts. Finally, the thus-produced capacitor to be cut into individual parts is cut into pieces along the groove or grooves to produce a plurality of ceramic capacitors 101.

Next, based on a conventional known method, while forming the built-up layer 31 on the upper surface 12 of the core board 11, the built-up layer 32 is formed on the lower surface 13 of the core board 11. More specifically, a sheet-like shaped thermosetting epoxy resin is laminated on both upper surface 12 and lower surface 13 of the core board 11 to form resin insulating layers 33, 34, serving as a first layer, each including a blind via at a location where the via conductors 43 is formed. It is noted that the resin insulating layers 33, 34 may be formed by applying liquefied thermosetting epoxy resin, instead of laminating the sheet-like shaped thermosetting epoxy resin.

Next, while performing an electrolytic copper plating to form the via conductors 43 inside of the blind vias in accordance with the conventional, known method (e.g., a semiadditive method), the conductor layers 42 are formed on the resin insulating layers 33, 34. In addition, a part of the via conductors 43 (the via conductors 43 where the conductor layer 42 is not connected to the upper end face) projects slightly from an upper surface of the resin insulating layer 33.

Figure 7:
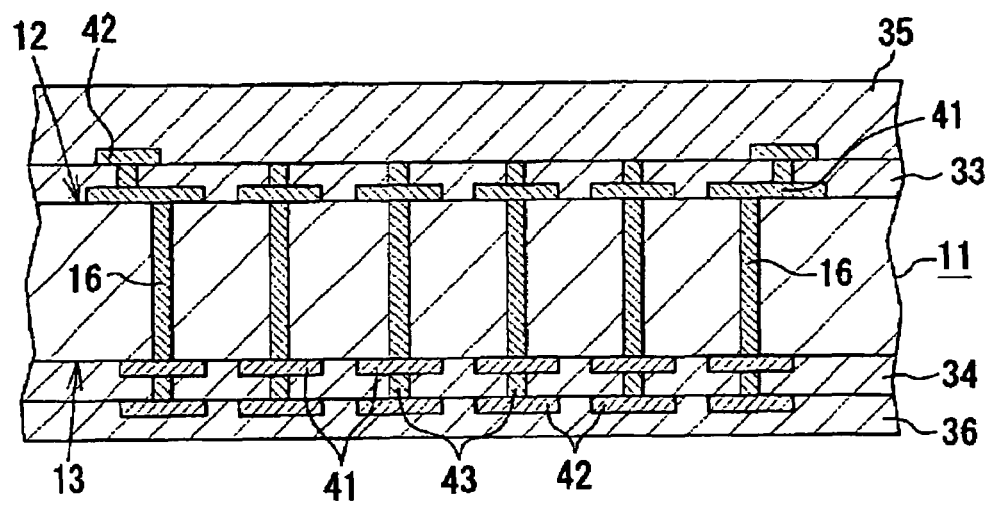
FIG. 7 is an explanatory cross-sectional view showing a subsequent step in a method for manufacturing a built-in capacitor type wiring board according to the first embodiment.

In a further step, another sheet-like or flat shaped thermosetting epoxy resin is laminated on each resin insulating layer 33, 34 serving as the first layer to form thereon unhardened resin insulating layers 35, 36 serving as a second layer (refer to FIG. 7). It is noted that the unhardened resin insulating layers 35, 37 may be formed by means of applying liquefied thermosetting epoxy resin, instead of laminating the sheet-like shaped thermosetting epoxy resin. Thereafter, formation of the built-up layers 31, 32 is terminated so that a mounting step can be conducted or carried out.

Figure 8:
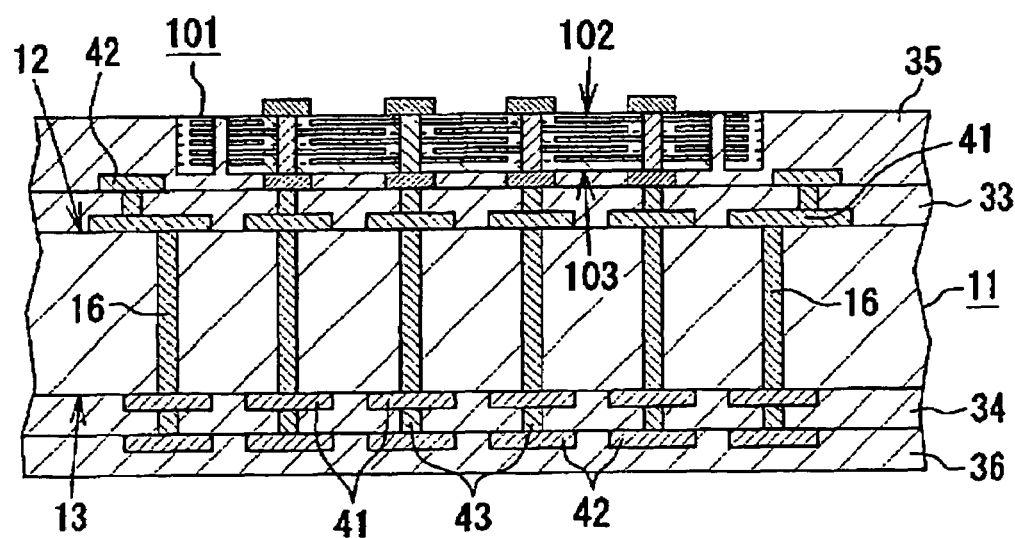
FIG. 8 is an explanatory cross-sectional view showing yet another step in a method for manufacturing a built-in capacitor type wiring board according to the first embodiment.
Figure 9:
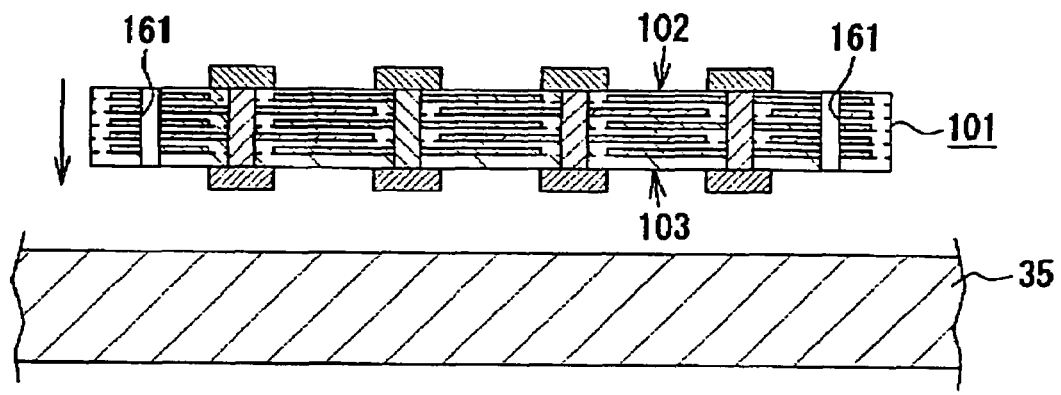
FIG. 9 is an explanatory cross-sectional view showing a mounting step according to the first embodiment.
Figure 10:
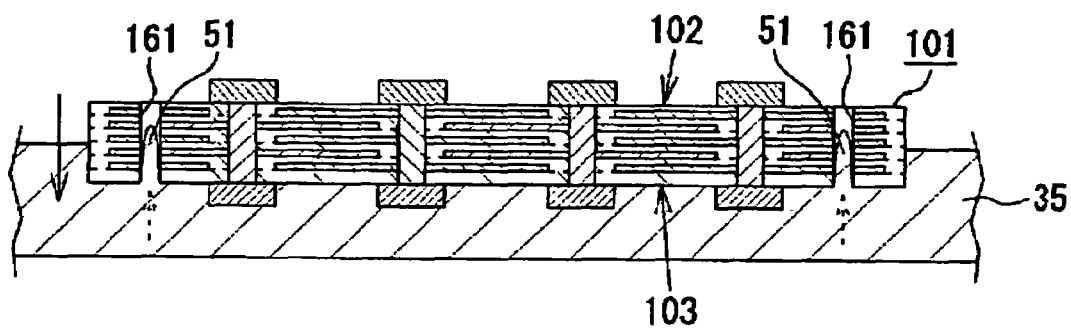
FIG. 10 is an explanatory cross-sectional view showing a further mounting step according to the first embodiment.

In the mounting step, the capacitor 101 is mounted on the resin insulating layer 33, which constitutes the built-up layer 31, using a mounting device so that the lower surface 103 of the capacitor 101 faces the resin insulating layer 33 (refer to FIGS. 8 to 10). At this time, the capacitor 101 is pressed downwardly so as to sink into the unhardened resin insulating layer 35 and to ultimately reach to the resin insulating layer 33. Since the capacitor 101 is pressed downwardly, the second outer terminal electrodes 121, 122 of the capacitor 101 securely contact the projecting portions of the via conductors 43 in the resin insulating layer 33.

When the capacitor 101 sinks into the resin insulating layer 35, a part 51 of the resin insulating layer 35 moves toward the outer circumference of the capacitor main body 104. The part 51 of the resin insulating layer 35 is not pushed out from an end face of the lower surface 103 of the capacitor main body 104, but instead flows into the hole portions 161 disposed along the outer circumference of the capacitor main body 104. In flowing into hole portions 161, a part 51 of the resin insulating layer 35 moves toward an open end of the hole portion 161 at the upper surface 102. As a result, while the position of the capacitor 101 is fixed, the coplanar relation of the resin insulating layer 35 is secured or maintained (refer to FIG. 10).

Figure 11:
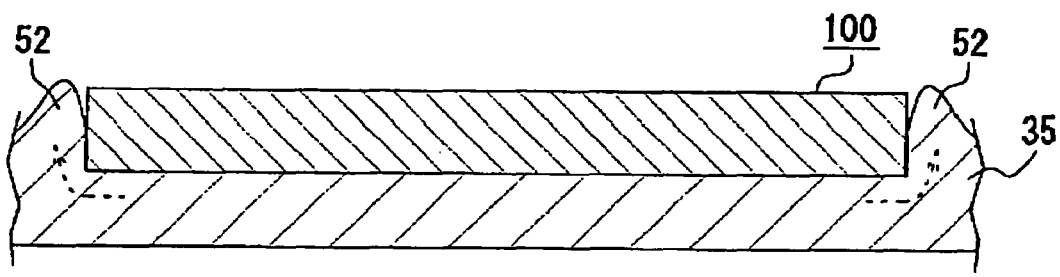
FIG. 11 is an explanatory cross-sectional view showing a mounting step when no hole portion is formed in a capacitor.

As shown in FIG. 11, when a capacitor 100 having no hole portion is employed, instead of the capacitor 101 of the embodiment described above, a part 52 of the resin insulating layer 35 moves toward the outer circumference of the capacitor 100 while the capacitor 100 sinks in the resin insulating layer 35. As a result, part 52 of the resin insulating layer 35 is pushed out from the an end face of a lower surface of the capacitor 100 and the planar or even nature (flatness) of the resin insulating layer 35 cannot be maintained.

After the mounting step, formation of the built-up layers 31, 32 starts again and an enclosure step is carried out. More specifically, the unhardened resin insulating layers 35, 36 serving as the second layer are cured. When this is done, the capacitor 101 is fixed in position without any misalignment. Then, a blind via is formed by a laser processing machine at a location where the via conductor 43 is formed in each resin insulating layer 35, 36. Subsequently, the electrolytic copper plating operation is performed in accordance with a conventional, known method so as to form the via conductors 43 inside of the blind via, as well as forming the conductor layer 42 on the resin insulating layers 35, 36.

Next, thermosetting epoxy resin of a sheet-like shape is laminated on each resin insulating layer 35, 36 serving as the second layer to form the resin insulating layers 37, 38 serving as a third layer, which has a blind via at a location where the via conductor 43 is formed, using a laser processing machine. In addition to the resin insulating layers 33, 35, another resin insulating layer 37 is laminated on the capacitor 101 so that the capacitor 101 is enclosed in the built-up layer 31. Here, the thickness of the resin insulating layers 37, 38 serving as the third layer is the same as that of the resin insulating layers 33, 34 serving as the first layer. The resin insulating layers 37, 38 may be formed by means of applying liquefied thermosetting epoxy resin instead of laminating a sheet-like thermosetting epoxy resin layer. Subsequently, the electrolytic copper plating is performed in accordance with a conventional, known method so as to form the via conductors 43 inside of the blind via and the conductor layer 42 on the resin insulating layer 37, and a BGA pad 48 on the resin insulating layer 38. It is noted that the built-up layer 32 is completed in this stage.

Figure 12:
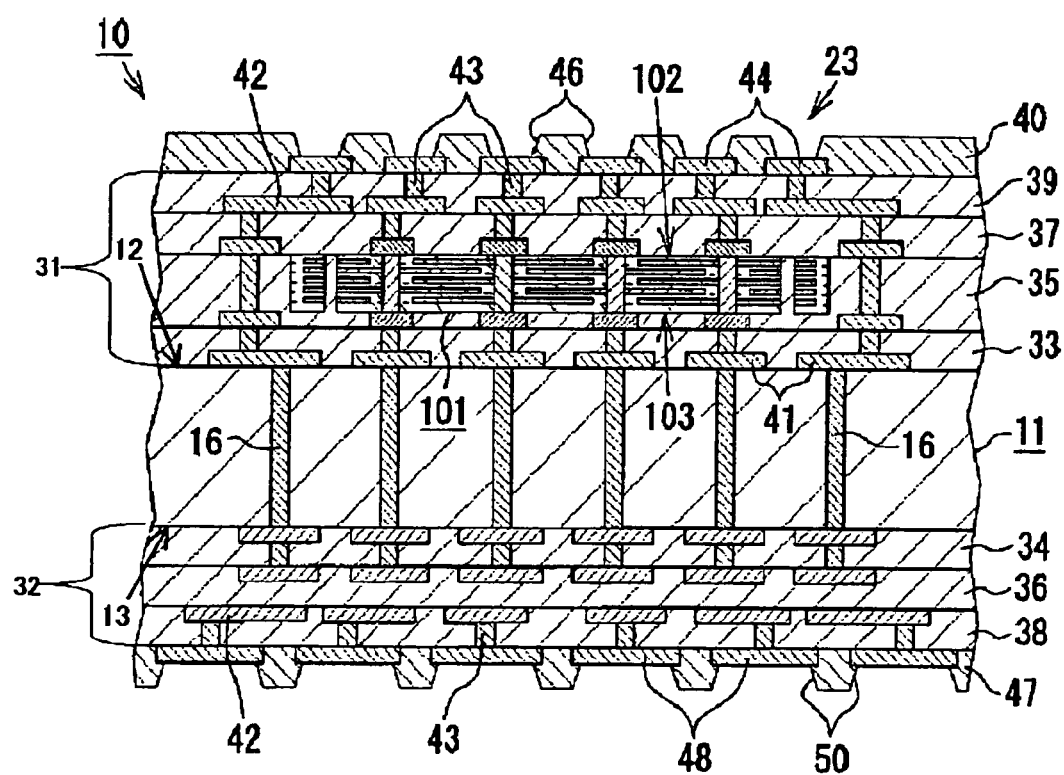
FIG. 12 is an explanatory cross-sectional view showing a method for manufacturing a built-in capacitor type wiring board according to the first embodiment.

Next, thermosetting epoxy resin of a sheet-like shape is laminated on the resin insulating layer 37 serving as the third layer to form the resin insulating layer 39 serving as a fourth layer, which has a blind via at a location where the via conductor 43 is formed, using a laser processing machine. The resin insulating layer 39 may be formed by applying liquefied thermosetting epoxy resin instead of laminating a sheet-like thermosetting epoxy resin layer. Subsequently, the electrolytic copper plating is performed in accordance with a conventional, known method so as to form the via conductor 43 inside of the blind via and the terminal pad 44 on the resin insulating layer 39. The built-up layer 31 is completed in this stage. Further, the built-in capacitor type wiring board 10 comprised of the core board 11, and the built-up layers 31, 32 in which the capacitor 101 is accurately embedded in the built-up layer 31 is completed (refer to FIG. 12).

According to this embodiment, the following effects and advantages can be attained.

According to the built-in capacitor type wiring board 10 of this embodiment, since a part 51 of the resin insulating layer 35 flows into the hole portion 161 when disposing the capacitor 101 on the resin insulating layer 33, misalignment of the capacitor 101 in the planar direction can be prevented. Further, the capacitor 101 is more tightly fixed in the built-up layer 31 as compared with the case where a hole portion 161 is not formed in the capacitor 101. Therefore, delamination between the capacitor 101 and the resin insulating layers 33, 37 can be prevented, and the high reliability can be attained.

In this embodiment, when a part 51 of the resin insulating layer 35 flows into the hole portion 161, only a small quantity of the resin insulating layer 35 is pushed out from the end face of the lower surface 103 of the capacitor 101. Thus, the planar nature of the resin insulating layer 35 is maintained. As a result, the planar nature of a mounting face of the overall built-up layer 31 is maintained and high reliability is provided in mounting the IC chip 21. Therefore, delamination of the built-up layer 31 due to thermal expansion or the like can be prevented so that high overall reliability is also attained.

According to this embodiment, since the semiconductor element mounting portion 23 of the built-up layer 31 is located directly above the capacitor 101, the semiconductor element mounting portion 23 is supported by the capacitor 101 which has high strength despite its thin body and is without unevenness, camber and ridging. Therefore, in the semiconductor element mounting portion 23, the mounting face of the surface of the built-up layer 31 is unlikely to be deformed, and the planarity or planar nature of the mounting face can be improved. As a result, the IC chip 21 mounted on the semiconductor element mounting portion 23 can be supported more stably. Thus, a large-scale IC chip, i.e., a chip with dimensions of 10 mm×10 mm or more, which normally tends to be greatly influenced by thermal stress and has high calorific power, or an IC chip Low-k (low dielectric constant) can be employed as the IC chip 21.

Second Embodiment

A built-in capacitor type wiring board 201 of a second embodiment will now be described in detail with reference to FIGS. 13 to 15. In this description, only the parts or portions of the built-in capacitor type wiring board 201 that are different from that of the first embodiment will be described. The same reference numerals are used for components constructed in the same manner as the built-in capacitor type wiring board 101, and any detailed description thereof will be omitted.

Figure 13:
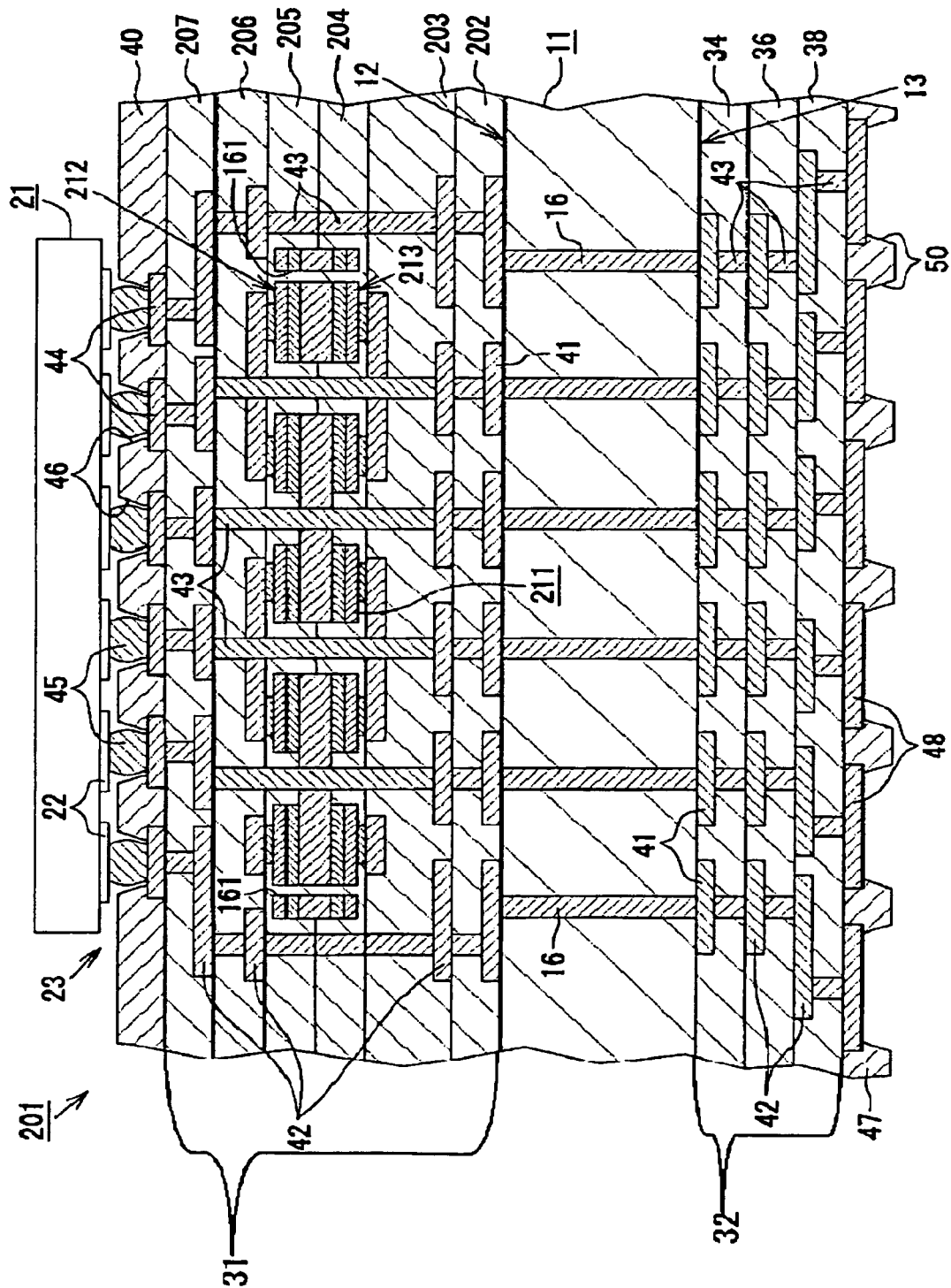
FIG. 13 is a schematic cross-sectional view showing a built-in capacitor type wiring board according to a second embodiment.

As shown in FIG. 13, in the built-in capacitor type wiring board 201, the built-up layer 31 has a structure wherein resin insulating layers 202, 203, 204, 205, 206, 207 (the so-called interlayer insulating layers) and a conductor layer 42 are alternately laminated, which is different from the structure of the first embodiment. Further, as shown in FIGS. 13 to 15, a built-in capacitor for a wiring board 211 (hereinafter referred to as "capacitor 211") embedded in the built-in capacitor type wiring board 201 is different from the capacitor 101 of the first embodiment.

Figure 14:
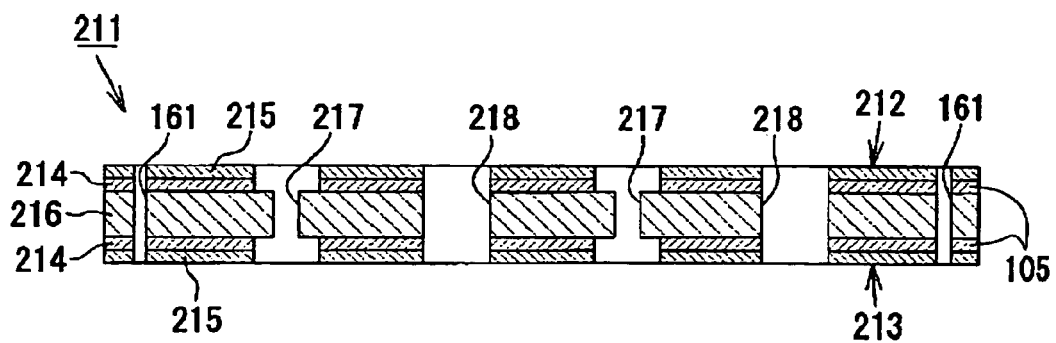
FIG. 14 is a schematic cross-sectional view showing a built-in capacitor for a wiring board according to the second embodiment.
Figure 15:
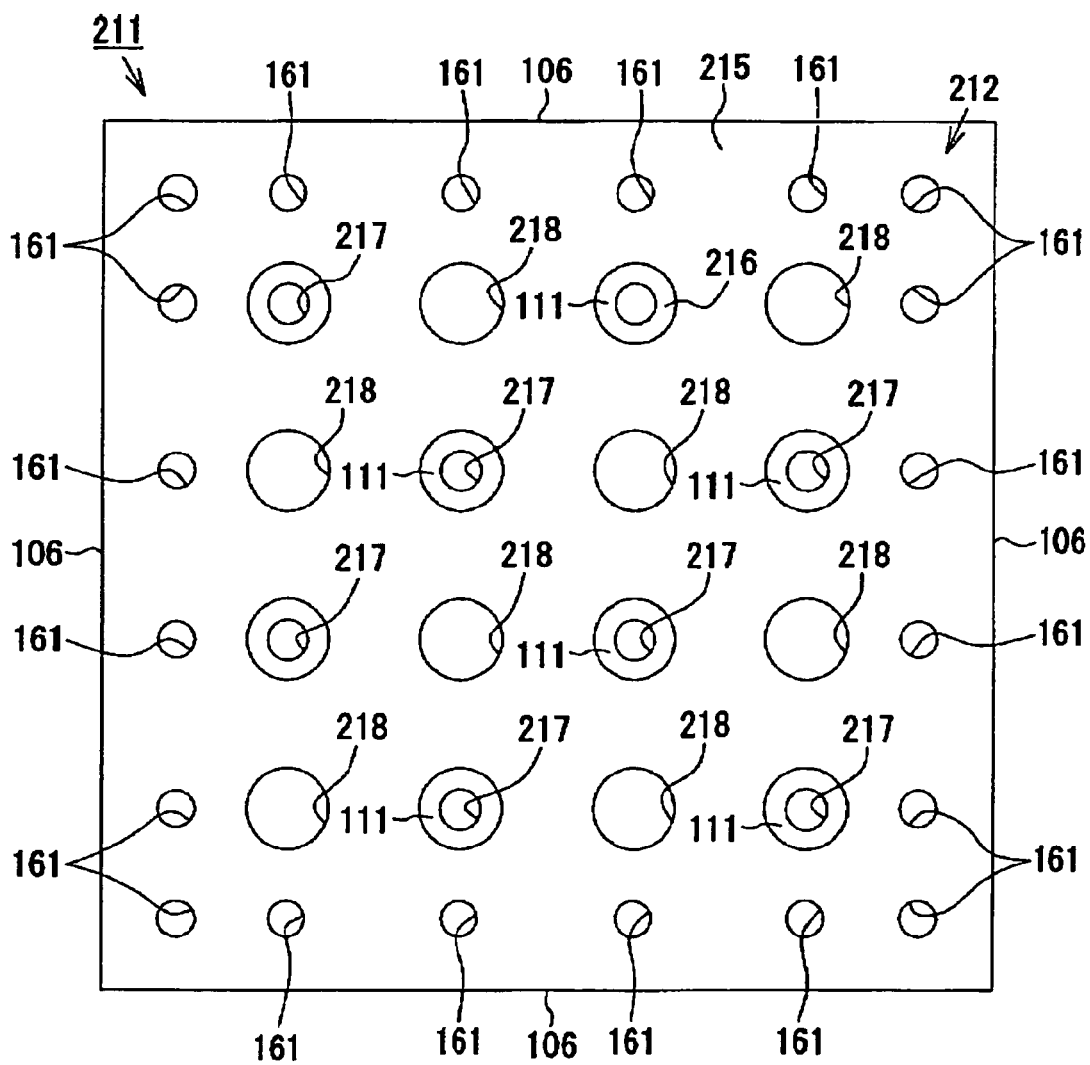
FIG. 15 is a schematic top plan view showing a built-in capacitor for a wiring board according to the second embodiment.

As shown in FIGS. 14 and 15, the capacitor 211 of this embodiment is a chip-like member having an upper surface 212 (also referred to as a first main surface) and a lower surface 213 (also referred to as a second main surface). The capacitor 211 of this embodiment is of a generally rectangular plate-like form, as viewed in plan, with dimensions of 15.0 mm(length)×15.0 mm(width)×0.06 mm(thickness). The resin insulating layer 205 constituting one layer of the built-up layer 31 is formed on the upper surface 212, and the resin insulating layer 204 constituting another layer of the built-up layer 31 is formed on the lower surface 213. The capacitor 211 is comprised of a ceramic dielectric layer 214 (dielectric layer) and an electrode layer 215 formed thereon. The ceramic dielectric layer 214 is comprised of a sintered body of barium titanate, a high dielectric constant ceramic, and the thickness thereof is between about 0.5 μm and 10 μm (and is 5 μm in this particular embodiment). The electrode layer 215 is comprised mainly of nickel, and the thickness thereof is between about 1 μm and 20 μm (and is 10 μm in this embodiment).

As shown in FIGS. 14 and 15, the ceramic dielectric layer 214 is supported by a metal reinforcement layer 216 having a thickness greater than that of the ceramic dielectric layer 214. The metal reinforcement layer 216 is comprised of nickel foil with the thickness of between about 10 μm and 100 μm (and is 30 μm in this embodiment). The ceramic dielectric layer 214 acts as a dielectric (insulator) between the electrode layer 215 and the metal reinforcement layer 216. In this embodiment, although the ceramic dielectric layer 214 and the electrode layer 215 are disposed at each side of the metal reinforcement layer 216, layers 214 and 216 may be disposed on only one side of the metal reinforcement layer 216.

As shown in FIGS. 14 and 15, a plurality of via holes 217, 218 is formed in the capacitor 211. These via holes 217, 218 penetrate the capacitor 211 in the thickness direction thereof (transversely) and are arranged in a lattice pattern (i.e., in the form of an array) over the whole surface of capacitor 211. Further, in each via hole 217, 218, the via conductors 43 provided in the resin insulating layers 204, 205 are formed. More specifically, these via conductors 43 are also arranged in a lattice pattern (i.e., in the form of an array) over the whole surface. Each via conductor 43 extending through the through-hole 217 penetrates the metal reinforcement layer 216 so as to be electrically connected to the metal reinforcement layer 216. On the other hand, the via conductor 43 extending through the through-hole 218 penetrates the conductor layer 42 formed on the resin insulating layer 203 and connected to the electrode layer 215, and the conductor layer 42 formed on the resin insulating layer 205 and connected to the electrode layer 215, so as to be electrically connected thereto.

As shown in FIGS. 13 to 15, similarly to the first embodiment, a plurality of hole portions 161 is formed along the outer circumference of the capacitor 211.

Next, a method for manufacturing the built-in capacitor type wiring board 201 of this embodiment will be described.

In a preparatory step, the core board 11 and the capacitor 211 are respectively produced in advance, using a conventional known method.

The capacitor 211 is produced as follows. First, a nickel foil with the thickness of 40 μm is prepared. Then, an etching or a punching process or the like is performed to form the metal reinforcement layer 216 in advance. Next, a ceramic green sheet is laminated on both sides of the metal reinforcement layer 216. Thereafter, a nickel paste for an electrode layer is screen-printed on these green sheets and dried. As a result, the electrode portion serving as the electrode layer 215 is formed and a ceramic non-sintered body is produced.

Using a laser processing machine, a boring process is performed with respect to the ceramic non-sintered body so as to provide communication with the through-hole already made in the metal reinforcement layer 216. As a result, a plurality of through-holes 217, 218 is formed in the ceramic non-sintered body. Next, the ceramic non-sintered body is degreased and sintered at a predetermined temperature for a predetermined duration. Thereafter, the barium titanate and nickel in the paste are simultaneously sintered, and the capacitor 211 is produced.

Next, based on a conventional known method, while forming the built-up layer 31 on the upper surface 12 of the core board 11, the built-up layer 32 is formed on the lower surface 13 of the core board 11. More specifically, resin insulating layers 202, 34 serving as a first layer are laminated on both upper surface 12 and lower surface 13 of the core board 11. Subsequently, the resin insulating layers 203, 36 serving as a second layer are respectively formed on the resin insulating layers 202, 34 serving as the first layer. Thereafter, the resin insulating layers 204, 38 serving as a third layer are respectively formed on the resin insulating layers 203, 36 serving as a second layer. At this point, formation of the built-up layers 31, 32 is terminated and a mounting step is conducted.

In the mounting step, the capacitor 211 is mounted on the resin insulating layer 203, which constitutes the built-up layer 31, using a mounting device so that the lower surface 213 of the capacitor 211 may face the resin insulating layer 203. At this time, the capacitor 211 is pressed downwardly so as to sink into the unhardened resin insulating layer 204 and reach to the resin insulating layer 203. When the capacitor 211 sinks in the resin insulating layer 204, a part of the resin insulating layer 204 flows into the hole portions 161. As a result, the capacitor 211 is fixed and the planarity or planar nature of the resin insulating layer 204 is secured.

After the mounting step, the formation of the built-up layers 31, 32 starts again and an enclosure step is conducted. More specifically, the resin insulating layer 205 serving as a fourth layer is laminated on the resin insulating layer 204 serving as the third layer so as to enclose the capacitor 211 in the built-up layer 31. The resin insulating layer 206 serving as a fifth layer and the resin insulating layer 207 serving as a sixth layer are laminated one by one on the resin insulating layer 205 serving as the fourth layer. As a result, the built-in capacitor type wiring board 201 is completed in which the capacitor 211 is accurately embedded in the built-up layer 31.

According to this embodiment, the capacitor 211 does not require a large number of layers as compared with a via array type capacitor because the capacitor 211 is provided with the metal reinforcement layer 216. Thus, the thickness of the entire capacitor 211 is decreased, in enabling the capacitor 211 to be easily embedded in the built-up layer 31. The capacitor 211 of this embodiment has the ceramic dielectric layer 214 and the electrode layer 215 which are not formed at one side of the metal reinforcement layer 216 but are formed at both sides thereof. Thus, any unevenness, camber and ridging of the sintered capacitor 211 can be reduced.

The embodiments described above may be modified, inter alia, as follows.

In the first embodiment, the capacitor 101 is prepared in a completed state in the preparation step. However, the capacitor 101 may be prepared in an incomplete state in the preparation step. More particularly, in this implementation, the capacitor 101 is prepared with via holes 130 wherein no via conductors 131, 132 are formed. In a further step, the via conductors 131, 132 are formed in the via holes 130 at the same time as forming the conductor layer 42 on the resin insulating layer 35, when performing the electrolytic copper plating in the enclosure step.

Figure 16:
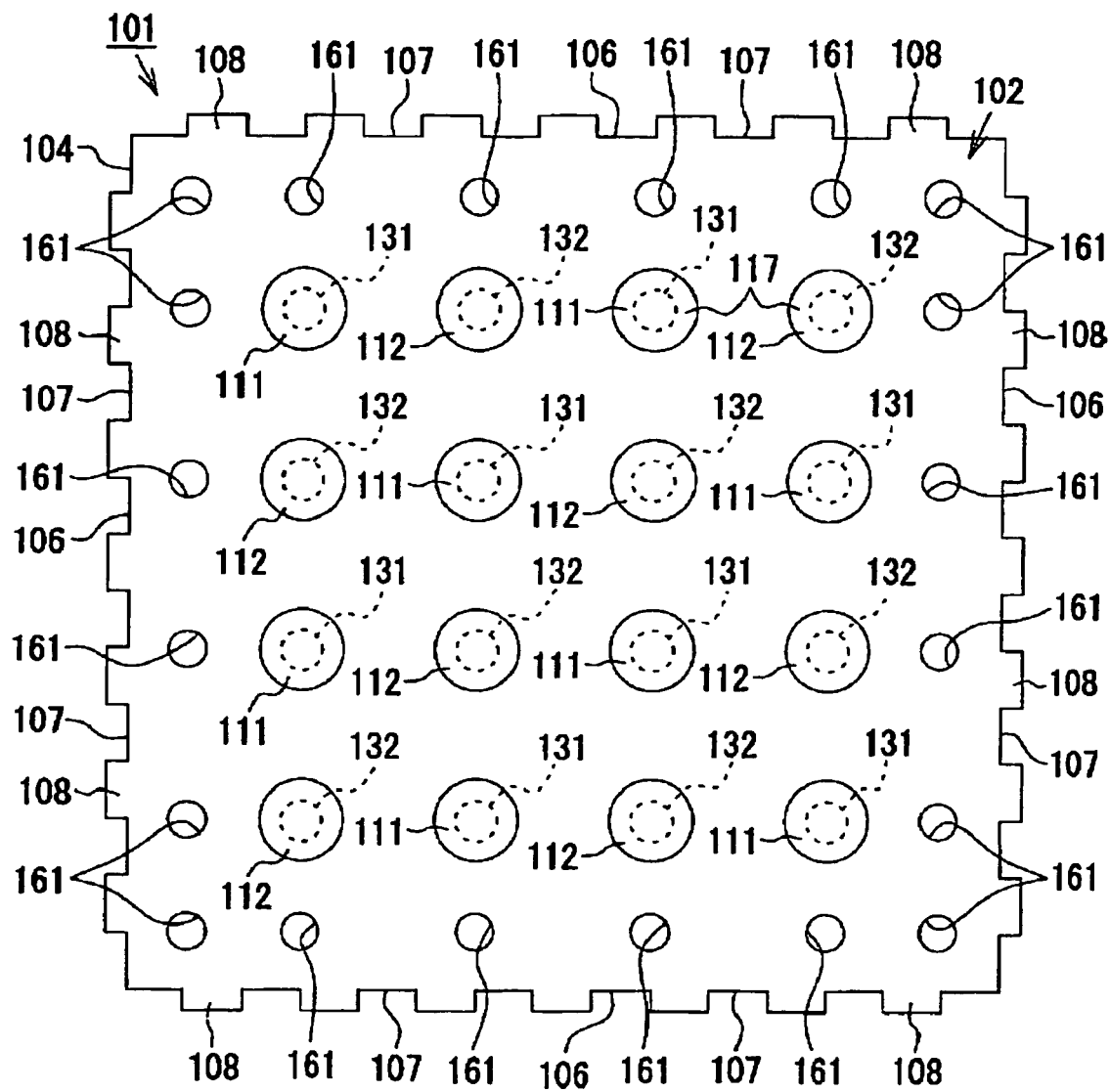
FIG. 16 is a schematic top plan view showing a built-in capacitor for a wiring board according to another embodiment.

As shown in FIG. 16, a concave portion 107 and a convex portion 108 may be alternately and regularly disposed along four sides 106 of the capacitor main body 104 (refer to FIG. 16). With this construction, when the capacitor 101 is embedded in the built-up layer 31 by being sunk into the unhardened resin insulating layer 35, any misalignment of the capacitor 101 in the planar direction can be prevented because the concave portion 107 and the convex portion 108 act as a resist, thereby improving the accuracy of the positioning of capacitor 101. The concave portion 107 and the convex portion 108 are formed by dividing the capacitors to be cut into an individual parts along a perforated line produced in such a manner that rectangular-shaped through-holes are formed at predetermined equal intervals.

Figure 17:
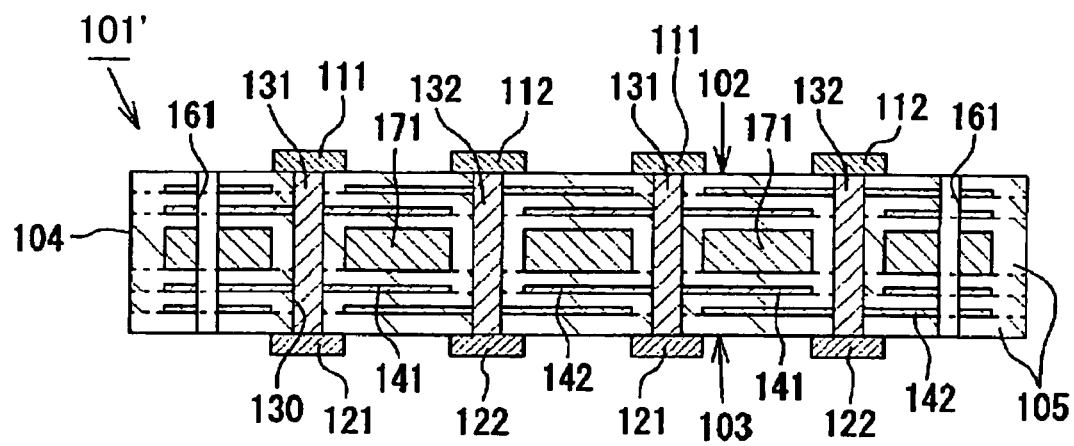
FIG. 17 is a schematic cross-sectional view showing a built-in capacitor for a wiring board according to another embodiment.

Turning to FIG. 17, in the capacitor 101 of the first embodiment, a reinforcement layer 171 may be formed inside of the ceramic dielectric layer 105 (e.g., the third ceramic dielectric layer 105 from the upper surface 102) (refer to FIG. 17). With this construction, the ratio of the metal portion to the overall or entire capacitor 101', is high whereby the entire capacitor 101' is reinforced by the metal portion. As a result, the flexibility and the strength of the capacitor 101' is improved, thereby preventing breakage of capacitor 101'.

It is noted that the reinforcement layer 171 may function as an inner electrode layer by electrically connecting to the via conductors 131, 132. With this construction, the capacitor 101' can securely perform its intended function, even if the ratio of the reinforcement layer 171 to the capacitor main body 104 increases.

Figure 18:
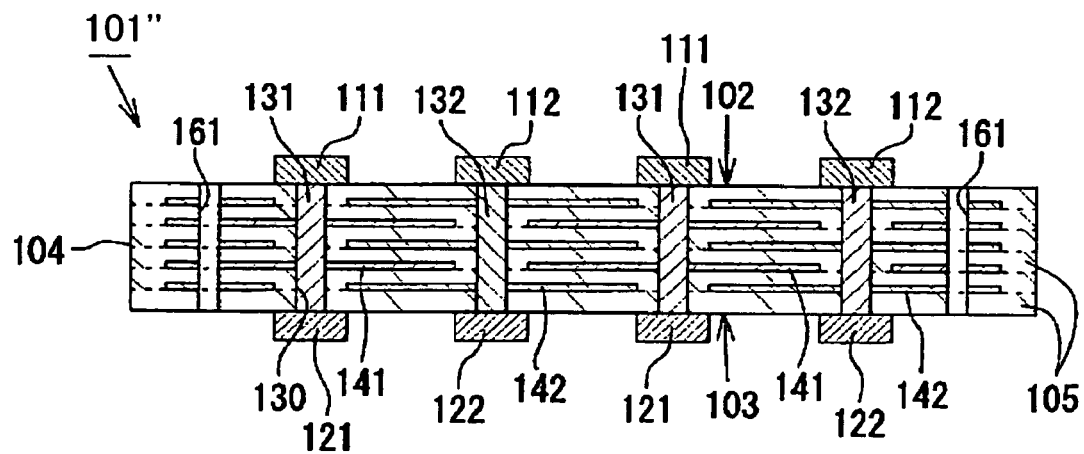
FIG. 18 is a schematic cross-sectional view showing a built-in capacitor for a wiring board according to another embodiment.

In FIG. 18, the capacitor 101 of the first embodiment, the thickness of the outer terminal electrodes 111, 112, 121, 122 may be made thicker than the case of the above-mentioned embodiment (refer to FIG. 18). In this way, the ratio of the metal portion to the overall or entire capacitor, denoted 101" becomes high. As a result, the overall or entire capacitor 101" is reinforced by the metal portion whereby the flexibility and the strength thereof improve. Thus, breakage of the capacitor 101" is prevented, even if the entire capacitor 101" is made thin.

In the capacitor 101 of the first embodiment, when enlarging the occupation area of the first outer terminal electrodes 111, 112 formed on the upper surface 102, the occupation area of the second outer terminal electrodes 121, 122 formed on the lower surface 103 may also be enlarged. With this construction, the ratio of the metal portion to the overall or entire capacitor 101 becomes high. As a result, the entire capacitor 101 is reinforced by the metal portion whereby the flexibility and the strength thereof improve. Thus, breakage of the entire capacitor 101 is prevented. Further, the planarity or even flatness of the mounting face of the built-up layer 31 improves because the unevenness of the upper surface 102 and the lower surface 103 is evened out to some extent, resulting in improving the mounting reliability after mounting the IC chip 21.

In the capacitor 101 of the first embodiment, a dummy electrode which is not electrically connected to the via conductors 131, 132 may be formed on an area of the upper surface 102 and the lower surface 103 where the outer terminal electrodes 111, 112, 121, 122 are not formed. With this construction, the ratio of the metal portion to the entire capacitor 101 is high. As a result, the entire capacitor 101 is reinforced by the metal portion whereby the flexibility and the strength thereof improve. Thus, breakage of the overall or entire capacitor 101 is prevented. Further, the planarity or planar nature of the mounting face of the built-up layer 31 is improved because the unevenness of the upper surface 102 and the lower surface 103 is evened out to some extent, thus improving the mounting reliability after mounting the IC chip 21.

In the first embodiment, a copper plating layer may be applied to the surface of the outer terminal electrodes 111, 112, 121, 122, and the surface of the copper plating layer may be roughened in order to improve the adhesion between the capacitor 101 and the resin insulating layers 33, 37.

Although the invention has been described above in relation to preferred embodiments thereof, it will be understood by those skilled in the art that variations and modifications can be effected in these preferred embodiments without departing from the scope and spirit of the invention.

What is claimed:

1. A built-in capacitor type wiring board, comprising:
  a core board;
  a multilayer portion formed on at least one side of said core board and comprising a plurality of interlayer insulating layers and a plurality of conductor layers alternately laminated on said core board; and
  a capacitor of a chip-like shape having a first main surface and a second main surface, said capacitor comprising:
  a dielectric layer;
  an electrode layer laminated on said dielectric layer; and
  at least one non-via hole opening at least at said second main surface, wherein said capacitor is embedded in said interlayer insulating layers so that said second main surface faces said core board.

2. A built-in capacitor wiring board according to claim 1, wherein said dielectric layer comprises a plurality of dielectric layers and said electrode layer comprises a plurality of inner electrode layers, and said capacitor comprises a capacitor main body having a structure wherein said dielectric layers and inner electrode layers are alternately laminated; and wherein said capacitor comprises a via array capacitor including a plurality of via holes disposed in an array and each via hole includes a via conductor therein providing an electrical connection to said inner electrode layers.

3. A built-in capacitor wiring board according to claim 2, wherein said at least one non-via hole has a diameter no greater than that of said via holes.

4. A built-in capacitor wiring board according to claim 1, wherein said capacitor includes a metal reinforcement layer supporting said dielectric layer and of a thickness greater than that of said dielectric layer.

5. A built-in capacitor wiring board according to claim 1, wherein at least one said non-via hole comprises at least one through-hole that opens at both said first main surface and said second main surface.

6. A built-in capacitor wiring board according to claim 1, wherein said at least one non-via hole comprises a plurality of holes disposed in plural locations along an outer circumference of said capacitor.

7. A built-in capacitor wiring board according to claim 1, wherein said capacitor has an overall thickness between about 10 μm and 200 μm.

8. A method for manufacturing a built-in capacitor type wiring board, said method comprising:

a preparation step comprising preparing a built-in capacitor of a chip-like shape having a first main surface and a second main surface, and comprising a dielectric layer, an electrode layer laminated on said dielectric layer and a hole portion opening at least at said second main surface;

a mounting step in which said capacitor is mounted on a first interlayer insulating layer which constitutes part of a multilayer portion comprising a plurality of interlayer insulating layers and a plurality of conductor layers alternately laminated on a core board, so that a part of said first interlayer insulating layer flows into said hole portion as a result of mounting said capacitor so as to face said second main surface; and an enclosure step wherein a further interlayer insulating layer is laminated on said capacitor after said mounting step so as to enclose said capacitor in said multilayer portion.

9. A built-in capacitor type wiring board, comprising:
a core board;
a multilayer portion formed on at least one side of said core board and comprising a plurality of interlayer insulating layers and a plurality of conductor layers alternately laminated on said core board; and
a capacitor of a chip-like shape having a first main surface and a second main surface, said capacitor comprising:
a dielectric layer;
an electrode layer laminated on said dielectric layer;
at least one non-via hole opening at least at said second main surface,
wherein said capacitor is embedded in said interlayer insulating layers so that said second main surface faces said core board;
said dielectric layer comprising a plurality of dielectric layers and said electrode layer comprising a plurality of inner electrode layers, and said capacitor comprising a capacitor main body having a structure wherein said dielectric layers and inner electrode layers are alternately laminated;
said capacitor comprising a via array capacitor including a plurality of via holes disposed in an array and each via hole includes a via conductor therein providing an electrical connection to said inner electrode layers; and
said at least one non-via hole portion comprising a plurality of holes disposed in plural locations around said via holes and along an outer circumference of said capacitor.

* * * * *